(12) United States Patent
Meier et al.

(10) Patent No.: US 12,174,221 B2
(45) Date of Patent: Dec. 24, 2024

(54) METHOD FOR PRODUCING A PULSE INVERTER, CURRENT MEASURING DEVICE FOR A PULSE INVERTER, PULSE INVERTER AND MOTOR VEHICLE

(71) Applicant: AUDI AG, Ingolstadt (DE)

(72) Inventors: Christoph Meier, Eitensheim (DE); Benjamin Söhnle, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 182 days.

(21) Appl. No.: 18/163,815

(22) Filed: Feb. 2, 2023

(65) Prior Publication Data

US 2023/0243873 A1    Aug. 3, 2023

(30) Foreign Application Priority Data

Feb. 3, 2022  (DE) .......................... 102022102601.9

(51) Int. Cl.
   *G01R 1/30*   (2006.01)
   *G01R 3/00*   (2006.01)
   *G01R 15/20*  (2006.01)
   *H05K 1/18*   (2006.01)
   *H05K 7/02*   (2006.01)

(52) U.S. Cl.
   CPC ................. *G01R 1/30* (2013.01); *G01R 3/00* (2013.01); *G01R 15/202* (2013.01); *G01R 15/205* (2013.01); *H05K 1/18* (2013.01); *H05K 7/02* (2013.01); *H05K 2201/10151* (2013.01)

(58) Field of Classification Search
   CPC ...... G01R 1/30; G01R 15/202; G01R 15/205; H05K 1/18; H05K 7/02
   See application file for complete search history.

(56) References Cited

U.S. PATENT DOCUMENTS

| | | | |
|---|---|---|---|
| 9,184,640 B2 | 11/2015 | Morimoto et al. | |
| 2011/0050222 A1* | 3/2011 | Ueno | G01R 15/207 324/253 |
| 2023/0253278 A1* | 8/2023 | Meier | H01L 23/3121 257/678 |

(Continued)

FOREIGN PATENT DOCUMENTS

| | | |
|---|---|---|
| DE | 102012200442 A1 | 9/2012 |
| KR | 101413484 B1 | 7/2014 |
| WO | WO 2017192256 A1 | 11/2017 |

*Primary Examiner* — Nathan Milakovich
(74) *Attorney, Agent, or Firm* — Seed IP Law Group LLP

(57) ABSTRACT

A method for producing a pulse inverter comprising a module with electronic components, a contact bar sticking out from a side of the module, a current measuring device arranged on the contact bar, and a control board arranged on the module with a driver circuit, wherein the driver circuit makes contact with the module across control contacting pins of the module and with the current measuring device across measurement contacting pins of the current measuring device, wherein the current measuring device is movably attached to the contact bar, after which the control board is positioned such that the control contacting pins are led through control contact openings of the control board and the current measuring device is displaced such that the measurement contacting pins are led through measurement contact openings of the control board, after which the current measuring device is secured to the contact bar and/or the control board.

19 Claims, 3 Drawing Sheets

(56) References Cited

U.S. PATENT DOCUMENTS

| | | | |
|---|---|---|---|
| 2023/0262943 A1* | 8/2023 | Ruppert | H05K 1/18 |
| | | | 361/707 |
| 2023/0299649 A1* | 9/2023 | Ruppert | H03H 1/0007 |
| | | | 310/72 |

* cited by examiner

METHOD FOR PRODUCING A PULSE INVERTER, CURRENT MEASURING DEVICE FOR A PULSE INVERTER, PULSE INVERTER AND MOTOR VEHICLE

BACKGROUND

Technical Field

Embodiments of the present invention relate to a method for producing a pulse inverter, especially a pulse inverter of a motor vehicle.

Description of the Related Art

Modern motor vehicles designed as electric or hybrid vehicles comprise a high-voltage onboard network making possible a power flow between components of the motor vehicle. Thus, by means of the onboard network, multiple components are electrically coupled together as consumers, such as air conditioning apparatus or the like, an electric energy accumulator, and an electric machine. While the consumers and the electric energy accumulator function in a direct current mode, the electric machine can be operated in an alternating current mode. There is a need to convert the alternating voltage present on the part of the electric machine for its energization into a direct current distribution bus of the onboard network, where the consumers and the electric energy accumulator are connected, and vice versa. For this, a pulse inverter is hooked up between the direct current distribution bus and the electric machine, by which the power flow between the direct current distribution bus and the electric machine can occur bidirectionally.

In connection with the control of the pulse inverter it is necessary to measure the current strength actually present in an electric terminal point of the pulse inverter, which can be provided specifically as a contact bar. Various concepts are known for this from the prior art.

Thus, DE 10 2012 200 442 A1 discloses an electronic unit provided for rectifying and inverting an electric voltage. This is hooked up between an external power source and a vehicle battery during a charging process for a vehicle battery. The electronic unit comprises input bars connected to the power source and output bars connected to the motor vehicle. Moreover, a rectifier is provided, which is connected to a printed circuit board for control purposes. Furthermore, there is provided a current sensor with a Hall sensor, by means of which the current strength of the direct current provided by the electronic unit is measured. The current sensor is connected to the circuit board by a flexible electric conductor.

One specific concept for measuring a current strength in a contact bar of an electric component of a motor vehicle is disclosed in KR 101413484 B1. For this, the contact bar runs through a sensor housing and is arranged between the legs of a magnetic shielding means of the sensor. Moreover, electric circuits are arranged between the legs, by which the current strength is measured thanks to the Hall effect.

BRIEF SUMMARY

Some embodiments provide an advantageous possibility of incorporating a current measuring device in a pulse inverter.

Some embodiments include a method for producing a pulse inverter comprising a module with multiple electronic components, at least one contact bar sticking out from the side of the module for electrical contacting of the pulse inverter with a contact external to the pulse inverter, especially with a direct current distribution bus or an electric machine of a motor vehicle, a current measuring device arranged on the contact bar for detecting a measurement signal regarding the electric current strength present in the contact bar, and a control board arranged on the top or bottom of the module with a driver circuit for control of the electronic components in dependence on the measurement signal, wherein the driver circuit makes electrical contact with the module across control contacting pins of the module and with the current measuring device across measurement contacting pins of the current measuring device, wherein the current measuring device is attached to the contact bar such that the current measuring device is movably mounted with respect to the contact bar, after which the control board is positioned such that the control contacting pins provided on the module are led through control contact openings of the control board and the current measuring device is oriented by displacing it such that the measurement contacting pins provided on the current measuring device are led through measurement contact openings of the control board, after which the current measuring device is secured to the contact bar and/or the control board.

Although the method described herein is generally intended for the production of a pulse inverter without further specification of its area of application, the method can be used in some embodiments in production of a pulse inverter of a motor vehicle.

The electronic components of the module are semiconductor electronic components, for example having inductive or capacitative properties that are suitable for the electrical rectifying and inverting of voltages on the order of magnitude of several hundred volts. The module can be fashioned as a plate, especially being cuboidal. The module may comprise a module housing with the electronic components contained therein.

The control board carries or encompasses the driver circuit. For this, electronic components of the driver circuit can be fastened to the control board, in particular, soldered, while the control board itself can have corresponding conductor tracks by which the components make contact with each other. The control board is arranged on top of or beneath the module. This means that the module, especially a platelike module, has an upper or lower outer surface, adjacent to which the control board is situated, in particular running parallel to it. The upper and lower outer surface of the module are joined together by means of a side wall extending along the vertical direction of the module.

The contact bar, which is also often called a bus bar, serves for the electric contacting of the pulse inverter in particular with the direct current distribution bus and with the electric machine, and hence the pulse inverter may have multiple contact bars. The contact bar extends on the one hand away from the module, starting from the side wall and extending in particular parallel to the upper or lower outer surface. On the other hand, the contact bar extends into the interior of the module housing where it is electrically connected to the electronic components. On the side with the direct current distribution bus, there can be provided two contact bars, on which a basically constant voltage level may be present. On the side with the electric machine, especially if this involves a three-phase electric motor, three contact bars can be provided.

The driver circuit is provided to actuate the electronic components of the module in connection with the rectifying or inverting. This actuation occurs in dependence on variable operating parameters, such as the current strength of the electric current actually flowing in the contact bar. In order to detect this current strength, the current measuring device is provided, being arranged on the respective contact bar, in particular being fastened to it.

Corresponding contacting pins or contacting tabs are provided for the electric contacting of the driver circuit with the electronic components and the current measuring device. In regard to these pins, a special challenge exists with regard to the assembly of the pulse inverter. Thus, the module has control contacting pins sticking out on top or on the bottom and the current measuring device has measurement contacting pins sticking out on top or on the bottom. During the assembly of the pulse inverter, the control board is placed on the module, the control contacting pins being introduced into control contact openings of the control board and the measurement contacting pins being introduced into measurement contact openings of the control board, forming press fit connections in particular. Since the fabrication of the module, the current measuring device, and the control board is subject to certain manufacturing tolerances, there is a danger that the positions of the pins and the positions of the openings will not match up or agree exactly, on account of many pins being introduced into the corresponding openings. A special problem in this regard is the fact that the current measuring device needs to be fastened to the contact bar, which also carries the risk of an unwanted deviation of the required relative positions between the control contacting pins and the measurement contacting pins. These position differences can make the inserting of the pins in the openings much more difficult or even impossible in the worst case.

This problem may be overcome by the fact that the current measuring device is at first not attached firmly or immovably to the contact bar. Although a mounting or attaching of the current measuring device to the contact bar is done, there exists at least one degree of freedom of movement in this regard with respect to the relative movement between the current measuring device and the contact bar and therefore between the current measuring device and the module. Now, this movable mounting is utilized such that several processes occur simultaneously or at the same time when placing the control board on the module. Thus, on the one hand, the control contacting pins are inserted into the control contact openings of the control board. At the same time, on the other hand, the current measuring device is oriented by means of its movable mounting on the contact bar, i.e., moved or positioned, while the measurement contacting pins are introduced into the measurement contact openings. The required relative positions between the control contacting pins and the measurement contacting pins result almost automatically in this process. Only after this step comes the final fastening of the current measuring device to the contact bar or to the control board. The control board can then be fastened to the module.

The current measuring device may be attached to the flat contact bar in such a way that the current measuring device is mounted floating with respect to the surface of the contact bar. Mounted floating means that the current measuring device has two degrees of freedom of movement with regard to the contact bar or the module. This means that the current measuring device is movable within the plane running along the flat contact bar or its surface. Although the current measuring device can also be attached to the contact bar such that it is mounted to be movable only in regard to a single direction in space, the floating mounting may be preferable, since this offers even greater flexibility in regard to the positioning of the pins.

The orienting of the current measuring device can be done in that at least one positioning pin provided on the current measuring device is led through a positioning opening of the control board. The outer diameter of the positioning pin can basically correspond to the inner diameter of the positioning opening, so that the mobility, especially the floating mounting, is eliminated when the positioning pin is inserted into the positioning opening. Since the relative positions between the positioning pin and the measurement contacting pins as well as the relative positions between the positioning opening and the measurement contact openings are the same, the orienting of the current measuring device is almost successfully completed with this. From the standpoint of an assembly operator, the positioning only requires inserting the positioning pin in the positioning opening.

The positioning pin may taper to a point at its free end, which further simplifies the inserting of this pin into the positioning opening. Furthermore, the positioning pin may extend further away from the current measuring device than the measurement contacting pins, so that the positioning pin is the first to be inserted in the positioning opening, thereby automatically giving the correct positioning of the measuring device pins. Two positioning pins may be provided on the measuring device.

Some embodiments relate to a current measuring device. In some embodiments, there is proposed in this regard a current measuring device for a pulse inverter, comprising a module with multiple electronic components, at least one contact bar sticking out from the side of the module for electrical contacting of the pulse inverter with a contact external to the pulse inverter, especially with a direct current distribution bus or an electric machine of a motor vehicle, wherein by means of the current measuring device arranged on the contact bar a measurement signal regarding an electric current strength present in a contact bar can be detected, wherein the pulse inverter comprises a control board arranged on the top or bottom of the module with a driver circuit for control of the electronic components in dependence on the measurement signal and the driver circuit makes electrical contact with the module across control contacting pins of the module and with the current measuring device across measurement contacting pins of the current measuring device, wherein the current measuring device comprises at least one connection means, by which it is secured to a fixed component of the pulse inverter in relation to the contact bar and/or to the contact bar, wherein the current measuring device comprises a first component and a second component, fastened to the first component, and between the components enclosing the contact bar there is formed a receiving space, in which the contact bar is arranged at least partly so that the current measuring device in a condition not yet secured by means of the connection means is mounted movably with respect to the contact bar. All the features and benefits explained in connection with the method described herein also hold for the current measuring device described herein and vice versa.

The attachment of the current measuring device to the contact bar therefore occurs in that it is arranged in the receiving space which is at least partly bounded by the first component and the second component of the current measuring device, such that the current measuring device is attached to the contact bar, yet there is still at least one degree of freedom of movement of the current measuring device relative to the contact bar.

The final fixation or fastening of the current measuring device, when the mobility is also eliminated with respect to this degree of freedom of movement, occurs with the final fastening of the current measuring device to the contact bar or to the control board by the connection means. The connection means can be provided to form a screw and/or a glue connection or the like.

In the current measuring device described herein it can be provided that the second component comprises a main body, especially a cuboidal one, and two legs sticking out from it and running substantially parallel to each other. Viewed in cross section, the second component in this embodiment has a U-shape, the two vertical arms of the U-shape representing the legs and the cross piece of the U-shape connecting the two vertical arms representing the main body. The first component in the assembled state may be situated between the legs. The receiving space can be open at two opposite sides and be situated between the first component and the second component. Since the receiving space in this embodiment is open at two opposite sides, the contact bar can extend through the corresponding openings.

It is conceivable for a locking protrusion to be arranged at each end of the leg facing away from the main body, so that the first component, especially a cuboid one, is held in position in the condition connected to the second component by means of one of the locking connections formed by the locking protrusions. The first component can accordingly be inserted or pushed in from above between the legs of the U-shaped second component, the locking protrusions being pressed into the legs or the legs being accordingly spread apart or bent away from each other. Once the locking protrusions have passed the first component, they lock or snap in place automatically to form the locking connection. The second component, at least the legs of the second component, can consist of plastic, so that the necessary elasticity for this is assured.

It is also conceivable for the first component and the second component to be secured to each other by a hinge, especially by a film hinge, and by a closure means, especially a detent means. In this embodiment, the open receiving space at the two opposite sides is formed between the film hinge and the closure means and between the first component and the second component. For the assembly, the contact bar is arranged in the space between the two components, which is then closed by swinging the components together about the hinge. This swinging movement is done until the closure means locks in place.

The contact bar can be a metal band or a metal plate. Accordingly, the contact bar basically has the geometrical shape of a flat, oblong cuboid or strip. The receiving space provided to receive this contact bar can likewise be cuboidal. The height of the receiving space may correspond to the height of the contact bar, while the width of the receiving space either corresponds to the width of the contact bar or is greater than it. Insofar as the width of the receiving space corresponds to the width of the contact bar, the current measuring device is only movable in this embodiment relative to the longitudinal direction of the contact bar. Insofar as the width of the receiving space is greater than the width of the contact bar, the current measuring device is additionally movable relative to the transverse direction of the contact bar. The current measuring device is therefore floating mounted accordingly.

As regards the first component, it can be provided that this comprises a first housing, especially one consisting of a plastic or a metal, and a measurement board situated therein with a measurement circuit designed to detect the measurement signal. As already mentioned, the receiving space for the contact bar can be bounded by the first component, so that there is basically provided a spatial proximity between the components arranged in the first housing and the contact bar such as is required to measure the current strength. Thus, for example, the current measuring device for detecting the measurement signal may comprise a Hall sensor and/or a magnetoresistive component, there being required in both cases such a proximity between the respective measurement means and the conductor or the contact bar with current flowing through it. Thus, both a Hall sensor and a magnetoresistive component with corresponding proximity to the contact bar are suitable for measuring the current strength by means of the strength of a magnetic field which is currently present and produced by the current flow. The functional principles of a Hall sensor and a magnetoresistive component, the ohmic resistance of which depends on the strength of the magnetic field which is present, are basically known. The measurement circuit comprises these measurement means as well as other components needed for the measurement. The measurement circuit is fastened, especially soldered, to the measurement board.

In regard to the second component, it can be provided that this comprises a second housing, especially one consisting of plastic or metal, and at least one shielding means at least partly arranged therein and/or fastened thereon, by means of which the magnetic field generated by the current flowing through the contact bar is focused and/or homogenized and/or external magnetic fields are shielded away. The shielding means can be for example a U-shield, the legs of which can run or be arranged in parallel with the legs of the second housing or inside it. The U-shapes of the second component and the shielding means can be appropriately adapted to each other. The shielding means consists of a ferromagnetic material. Thanks to the shielding means, the current measurement taken by means of the Hall sensor or the magnetoresistive component is improved in regard to its accuracy.

Some embodiments relate to a pulse inverter. Some embodiments include a pulse inverter comprising a module with multiple electronic components, at least one contact bar sticking out from the side of the module for electrical contacting of the pulse inverter with a contact external to the pulse inverter, especially with a direct current distribution bus or an electric machine of a motor vehicle, wherein by means of the current measuring device arranged on the contact bar as described above a measurement signal regarding the electric current strength present in the contact bar can be detected, wherein the pulse inverter comprises a control board arranged on the top or bottom of the module with a driver circuit for control of the electronic components in dependence on the measurement signal and the driver circuit makes electrical contact with the module across control contacting pins of the module and with the current measuring device across measurement contacting pins of the current measuring device. The features and benefits explained in connection with the method described herein and the current measuring device described herein also hold for the pulse inverter described herein and vice versa.

In the pulse inverter described herein it can be provided that the control board is connected to the current measuring device by means of press fit connections formed by the measurement contacting pins received in the contact openings. The measurement contacting pins in this embodiment constitute in particular press-in pins, the extension of which is larger than the extension of the control contact openings of the control board, so that when the control board is placed on the module and the measurement contacting pins are introduced into the measurement contact openings a plastic deformation of the press-in pins occurs, thereby producing a holding force and thus a fastening. The placing of the control board on the module and the fastening of the current measuring device to the control board occur almost at the same time in this embodiment. In addition or alternatively, the control board can be connected to the module by means of press fit connections formed by the control contacting pins received in the control contact openings. In this embodiment, the electric contacting points bring about mechanical fastening points in synergistic manner.

In addition or alternatively it is conceivable for the current measuring device to be fastened to the contact bar and/or the control board by means of at least one screw and/or glue connection. Thus, the screwing and/or gluing can be provided as the final step when joining together the corresponding components when manufacturing the pulse inverter in the context of the above explained method.

In the pulse inverter described herein it can be provided that the contact bar is a metal band or a metal plate. The contact bar can be coated in the interest of the greatest possible corrosion resistance.

The surface of the contact bar and the plane of the control board may run substantially parallel to each other and the control contacting pins and the measurement contacting pins may run substantially perpendicular to the surface of the contact bar and to the plane of the control board. Some embodiments relate to a motor vehicle comprising a pulse inverter as described above.

All the features and benefits explained in connection with the method described herein, the current measuring device described herein, and the pulse inverter described herein also hold for the motor vehicle described herein and vice versa.

BRIEF DESCRIPTION OF THE SEVERAL VIEWS OF THE DRAWINGS

Further details will emerge from the embodiments explained below and from the figures.

DETAILED DESCRIPTION

Figure 1:
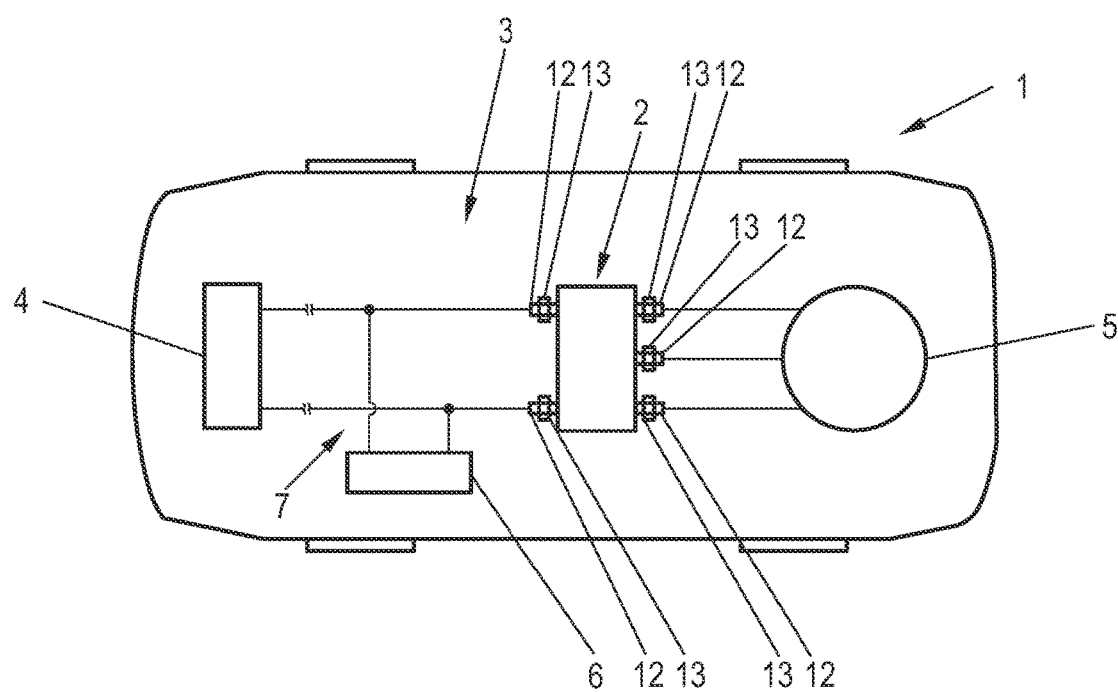
FIG. 1 illustrates a motor vehicle comprising a pulse inverter having a current measuring device.

FIG. 1 shows an embodiment of a motor vehicle 1 with an embodiment of a pulse inverter 2. However, the pulse inverter 2 can also be provided for other application purposes independently of the motor vehicle 1. The motor vehicle 1 is configured as an electric vehicle. It comprises an onboard network 3, in which an electric energy accumulator 4, an electric machine 5 for driving the motor vehicle 1 and further consumers 6 such as an air conditioner of the motor vehicle 1 are incorporated. Since the electric energy accumulator 4 and the consumers 6 are operated by means of DC voltage, these components are electrically connected to a direct current distribution bus 7 of the onboard network 3.

The pulse inverter 2 serves for transforming the DC voltage present on the side with the direct current distribution bus 7 into an alternating voltage present on the side with the electric machine 5, and vice versa. Thus, the electric Machine 5 can be used as an electric motor for driving the motor vehicle 1, energy being transferred from the energy accumulator 4 via the direct current distribution bus 7 and the pulse inverter 2 to the electric machine 5. Moreover, an energy flow occurs from the electric machine 5 across the pulse inverter 2 and the direct current distribution bus 7 to the electric energy accumulator 4 and/or to the consumers 6, for example during a recuperation phase of the motor vehicle 1.

Figure 2:
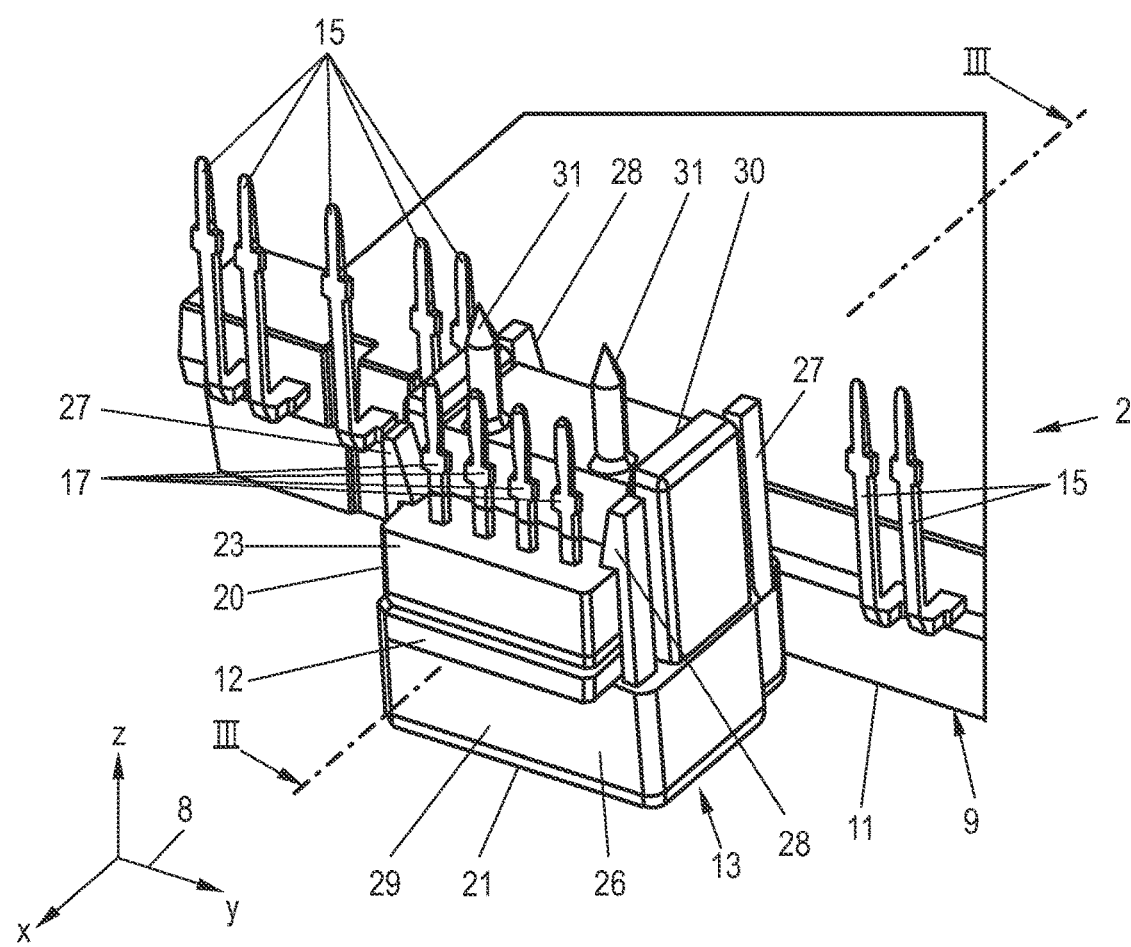
FIG. 2 illustrates a perspective view of a portion of the pulse inverter of the motor vehicle of FIG. 1.
Figure 3:
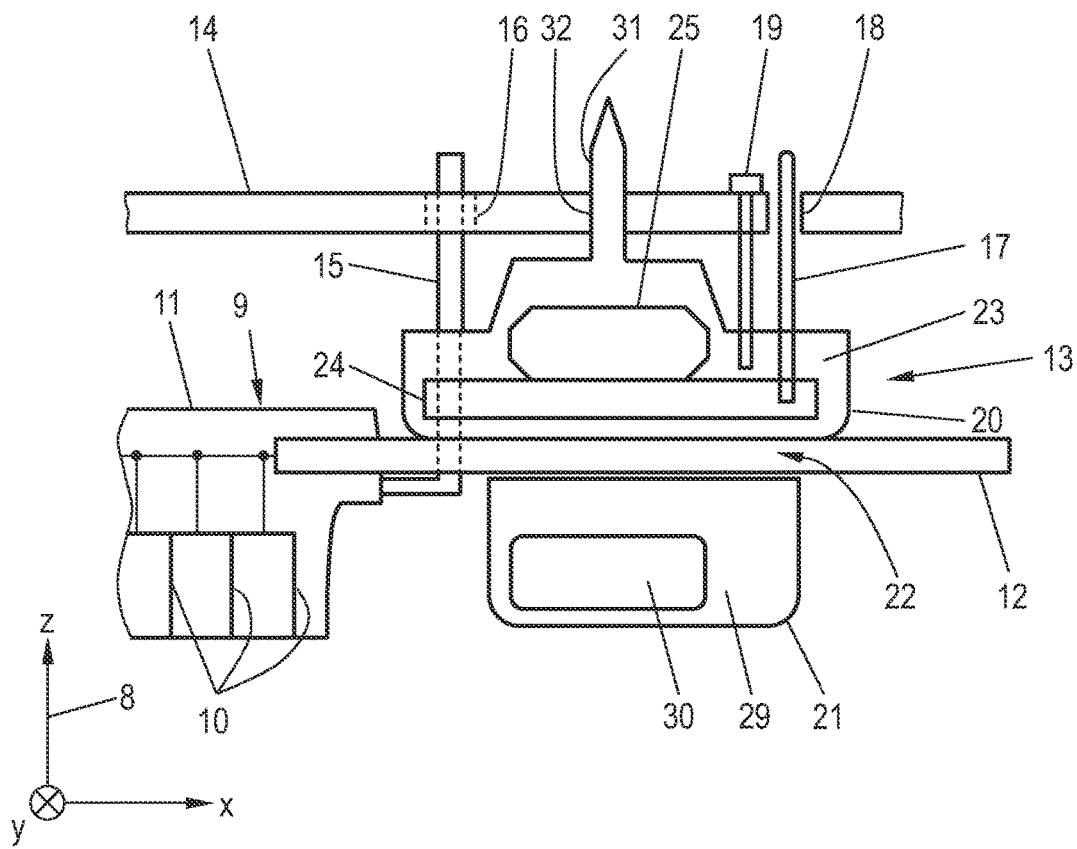
FIG. 3 illustrates a cross sectional view through the pulse inverter of FIG. 2 along line III-III.

FIG. 2 shows a perspective view of a portion of the pulse inverter 2. FIG. 3 shows a cross section through this portion along line shown in FIG. 2. In FIGS. 2 and 3, for better orientation, a coordinate system 8 is shown in which the x axis extends along the longitudinal direction of the vehicle, the y axis along the transverse direction of the vehicle, and the z axis along the vertical direction of the vehicle.

The pulse inverter 2 comprises a module 9 with multiple electronic components 10 and a module housing 11. The electronic components 10 are semiconductor-based components with inductances or capacitances, by means of which the rectifying and inverting are carried out.

The pulse inverter 2 further comprises contact bars 12 sticking out from the side of the module 9 and configured as a metal band or a metal plate for the electrical contacting of the pulse inverter 2 with the electric machine 5 and direct current distribution bus 7. According to FIG. 1, a total of 5 such contact bars 12 are provided. FIGS. 2 and 3 show only one of the contact bars 12 for better visibility, while the viewpoints explained with the aid of FIGS. 2 and 3 basically hold also for the other contact bars 12.

On the contact bar 12 there is arranged a current measuring device 13, by which a measurement signal is detected regarding an electric current strength present in the contact bar 12. The pulse inverter 2 further comprises a control board 14 situated on the top of the module 9 with a driver circuit for control of the electronic components 10 in dependence on the measurement signal detected by means of the current measuring device 13. For better visibility, the driver board 14 is shown only in FIG. 3, but not in FIG. 2. The driver circuit or the control board 14 makes electrical contact with the module 9 across control contacting pins 15 of the module 9. The control contacting pins 15 provided on the module 9 are led through contact openings 16 of the control board 14.

Furthermore, measurement contacting pins 17 are provided on the current measuring device 12, which are led through measurement contact openings 18 of the control board 14. The measurement contacting pins 17 serve for the contacting of the current measuring device 13 with the driver circuit 14, especially in regard to the transmission of the measurement signal and the energization of the current measuring device 13 required for the measurement process.

As regards the fastening of the current measuring device 13, a connection means 19 is provided by which the current measuring device 13 is fastened to a component of the pulse inverter 9 which is fixed in relation to the contact bar 12 in the final assembled state, namely, the control board 14. The connection means is for example a screw, which reaches through a screw opening of the control board 14 and engages with an internal thread of the current measuring device 13. In addition or alternatively, a glue connection is conceivable as the connection means.

In the following, details shall be explained as to the layout and functioning of the current measuring device 13. The current measuring device 13 comprises a first component 20 and a second component 21 connected to the first component 20. The components 20, 21 enclose the contact bar 12.

Specifically, a receiving space 22 is formed between the components 20, 21, in which a portion of the contact bar 12 extends.

The first component 20 has a cuboidal first housing 23 consisting of plastic. In the first housing 23 there is arranged a measurement board 24 with a measurement circuit provided to detect the measurement signal. The detecting of the measurement signal occurs by means of a Hall sensor 25, while alternatively a magnetoresistive component can also be provided. By means of the Hall sensor 25, a magnetic field strength is detected for a magnetic field which is caused by the electric current flowing in the contact bar 12 and which is stronger as the current strength is greater.

The second component 21 has a cuboidal main body 26 and two legs 27 sticking out from it toward the top and arranged parallel to each other. The first component 20 in the final assembled state shown in FIGS. 2 and 3 is arranged between the legs 27. Each time a locking protrusion 28 is formed at the end of the legs 27 facing away from the main body 26, reaching across the first component 20 or its housing 23 on top and holding it in position.

It becomes clear from the configuration just described and shown in FIGS. 2 and 3 that the receiving space 22 provided to receive the contact bar 12 is cuboidal. The receiving space 22 is bounded by the legs 27, the main body 26 and the first component 20. The receiving space 22 is open at two opposite sides, the contact bar 12 extending along the x direction entering and emerging once more from the receiving space 22 through corresponding openings in it. These openings have the effect that the current measuring device 13, in an assembled state in which the connection means 19 is not yet mounted or the screw has not yet been inserted and tightened, can be shifted along the longitudinal direction of the contact bar 12, i.e., along the x direction.

The width of the receiving space 22, i.e., its extension in the y direction, is greater than the width of the contact bar 12. This means that the current measuring device 13 in the assembled state in which the connection means 19 is not yet mounted can be shifted transversely to the contact bar 12, i.e., along the y direction. The height of the receiving space 22, i.e., its extension in the z direction, corresponds to the height of the contact bar 12, so that no significant mobility exists for the current measuring device 13 relative to the contact bar 12 in terms of this spatial direction, regardless of the connection means 19.

Thus, on the whole, a floating mount of the current measuring device 13 on the contact bar 12 is realized during the assembly process of the pulse inverter 2, and this for as long as the connection means 19 has not yet been brought into the corresponding assembled state or the screw has not yet been inserted and tightened.

Furthermore, it should be mentioned in regard to the floating mount that the width of the receiving space 22 can also correspond to the width of the contact bar 12. In this case, the current measuring device 13 is not mounted floating, but instead is only lengthwise movable, as long as the connection means 19 has not yet been mounted or installed.

As already mentioned above, the first component 20 comprises the measurement board 24 with the measurement circuit provided for detecting the measurement signal and comprising the Hall sensor 25. In order to implement this measurement concept, it is provided in regard to the second component 21 that the main body 26 comprises a cuboidal second housing 29 made of plastic, while a magnetic shielding means 30 extends or runs through the second housing 29 as well as the legs 27, which can likewise consist of a plastic, with which the magnetic field generated by the electric current in the contact bar 12 is focused and homogenized on the Hall sensor 25. Moreover, the shielding means 30 protects the Hall sensor 25 in regard to external magnetic fields which are thus disruptive to the measurement. Specifically, the shielding means 30 is a ferromagnetic so-called U-shield, the cross bar of which lies within the second housing 29 and its legs lie within the legs 27 of the second component 21.

In the following, the method described herein for production of the pulse inverter 2 shown in FIGS. 2 and 3 shall be explained. At first, the second component 21 is arranged on the contact bar 12 such that it is positioned between the legs 27. Next, the first component 20 is pushed in from above between the legs 27, and thus until the first component 20 touches the top side of the contact bar 12. The dimensions of the components involved are such that the locking protrusions 28 or the legs 27 at this time spring back elastically so that they reach across the first housing 23 of the first component 20 at the top and thereby hold it firmly in this position.

It is important that the current measuring device 13 in this state is attached movably to the contact bar 12, namely for as long as the connection means 19 has not yet been placed in its final assembled position. Specifically, the aforementioned floating mount is realized in this regard.

In the next step, the control board 14 is brought up to the module 9 or placed thereon so that the control contacting pins 15 pass or are led through the control contact openings 16 of the control board 14. At the same time, the current measuring device 13 is shifted by means of the floating mount such that the measurement contacting pins 17 provided on the current measuring device 13 pass or are led through the measurement contact openings 18 of the control board 14.

Because the current measuring device 13 and hence the measurement contacting pins 17 are oriented during the placement of the control board 14 and not yet fixed in the final assembled position, one avoids the problem of wrong positioning of the pins 15, 17 due to typically occurring manufacturing tolerances making the assembly process more difficult or even impossible in the worst case.

Only after the placement of the control board 14 and the orienting of the current measuring device 13 is the latter fastened to the control board 14 by the connection means 19. The control board 14 has likewise been fastened in advance by means of corresponding screw connections to the module 8 or the module housing 11. In addition or alternatively, the current measuring device 13 can be fastened to the contact bar 12, especially by means of an adhesive.

It is then provided in the final assembled state achieved in the pulse inverter 2 that the surface of the contact bar 12 and the plane of the control board 14 run parallel to each other. Moreover, the control contacting pins 15 and the measurement contacting pins 17 stand perpendicular to the surface of the contact bar 12 and to the plane of the control board 14.

In order to facilitate the placement or positioning of the control board 14 and the simultaneous orienting of the current measuring device 13 for the assembly operator, the current measuring device 13 has two positioning pins 31, which are led through corresponding positioning openings 32 of the control board 14 for orienting the current measuring device 13. The positioning pins 31 extend further upward than the other measurement contacting pins 17, so that the positioning pins 31 are the first to be inserted in the corresponding positioning openings 32 when the control board 14 is placed on the module 9. This inserting is further assisted in that the free ends of the positioning pins 31 taper to a point in front. By inserting the two positioning pins 31 in the two positioning openings 32, the current measuring device 13 is oriented almost automatically, after which the measurement contacting pins 17 are introduced into the measurement contact openings 18.

The electric contacting points are formed by the pins 15, 17 introduced into the openings 16, 18. These contacting points form so-called press fit connections, by means of which an additional mechanical connection is produced between the module 9, the current measuring device 13, and the control board 14. The pins 15, 17 are press-in pins, the extension of which is greater than the extension of the openings 16, 18, so that when the control board 14 is placed on the module 9 and the pins 15, 17 are introduced into the openings 16, 18 a plastic deformation of the press-in pins occurs and a holding force is produced in this way.

Figure 4:
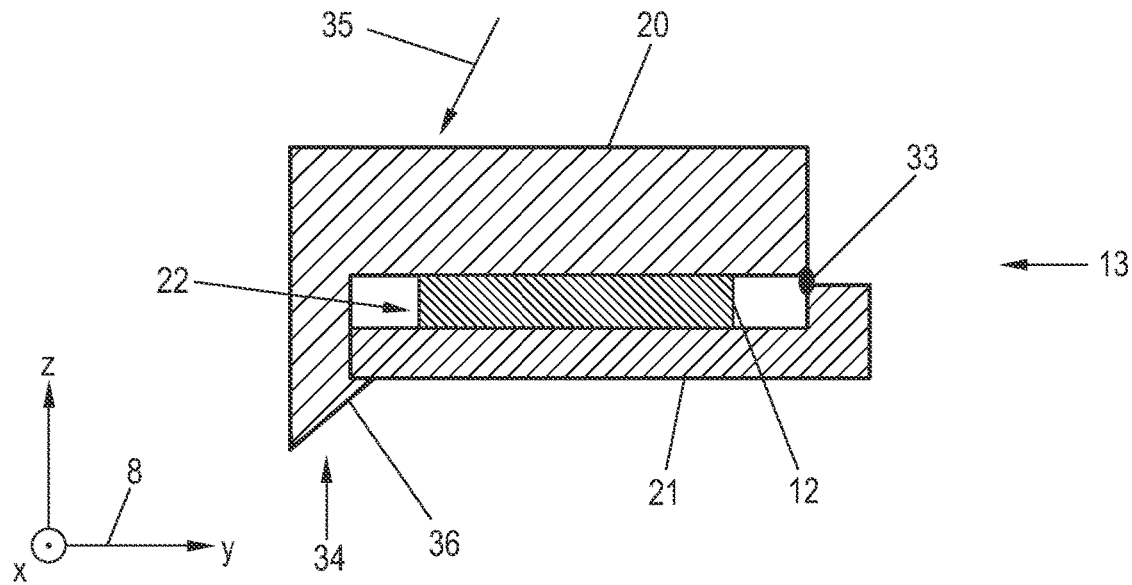
FIG. 4 illustrates a side view of a current measuring device.

FIG. 4 shows a further embodiment of a current measuring device 13. FIG. 4 shows only the first component 20 and the second component 21, since the other features, unless expressly indicated otherwise, correspond to the features of the current measuring device 13 explained in the context of FIGS. 1 to 3. Thus, in this embodiment, the components 20, 21 are joined together or fastened to each other by a hinge 33, configured as a film hinge, and a closure means 34. By contrast with the embodiment shown in FIGS. 1 to 3, no shielding means 30 is provided in the current measuring device 13 shown in FIG. 4, and neither does the second component 21 have any legs 27. Both components 20, 21 are cuboidal in this embodiment.

For the assembly, the contact bar 12 in this embodiment is arranged in the space between the components 20, 21, after which the receiving space 22 is closed by swiveling the first component 20 toward the second component 21 about the hinge 33 and along the arrow 35. This swiveling movement is done until the closure means 34 locks in place, being in the present instance a detent means 36 with a locking protrusion.

German patent application no. 10 2022 102601.9, filed Feb. 3, 2022, to which this application claims priority, is hereby incorporated herein by reference in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A method for producing a pulse inverter comprising a module with electronic components, a contact bar sticking out from a side of the module for contacting the pulse inverter with a contact external to the pulse inverter, a current measuring device arranged on the contact bar for detecting a measurement signal regarding a current strength in the contact bar and a control board arranged on a top or bottom of the module with a driver circuit for control of the electronic components in dependence on the measurement signal, wherein the driver circuit makes electrical contact with the module across control contacting pins of the module and with the current measuring device across measurement contacting pins of the current measuring device, the method comprising:

attaching the current measuring device to the contact bar such that the current measuring device is movably mounted with respect to the contact bar, after attaching the current measuring device to the contact bar, positioning the control board such that the control contacting pins provided on the module are led through control contact openings of the control board, orienting the current measuring device by displacing it such that the measurement contacting pins provided on the current measuring device are led through measurement contact openings of the control board, and after orienting the current measuring device, securing the current measuring device to the contact bar and/or the control board.

2. The method according to claim 1, wherein the current measuring device is attached to the contact bar in such a way that the current measuring device is mounted floating with respect to a surface of the contact bar.

3. The method according to claim 1, wherein the orienting of the current measuring device is done in that at least one positioning pin provided on the current measuring device is led through a positioning opening of the control board.

4. The method according to claim 3 wherein the at least one positioning pin is a tapering positioning pin.

5. A current measuring device for a pulse inverter, the pulse inverter comprising a module with multiple electronic components, at least one contact bar sticking out from a side of the module for electrical contacting of the pulse inverter with a contact external to the pulse inverter, wherein a measurement signal regarding an electric current strength present in the at least one contact bar can be detected by the current measuring device arranged on the at least one contact bar, wherein the pulse inverter further comprises a control board arranged on a top or bottom of the module with a driver circuit for control of the electronic components in dependence on the measurement signal and the driver circuit makes electrical contact with the module across control contacting pins of the module and with the current measuring device across measurement contacting pins of the current measuring device, the current measuring device comprising:

at least one connection, by which the current measuring device is secured to a fixed component of the pulse inverter in relation to the at least one contact bar and/or to the control board; and a first component and a second component, fastened to the first component, and between the components enclosing the at least one contact bar there is formed a receiving space, in which the at least one contact bar is arranged at least partly so that the current measuring device in a condition not yet secured by the connection is mounted movably with respect to the at least one contact bar.

6. The current measuring device according to claim 5, wherein the second component comprises a main body and two legs sticking out from the main body and running substantially parallel to each other, wherein the first component in a condition fastened to the second component is arranged between the legs, wherein the receiving space open respectively on two opposite sides is formed between the legs and between the first component and the second component.

7. The current measuring device according to claim 6, wherein a locking protrusion is arranged at each end of the leg facing away from the main body, so that the first component is held in position in a condition connected to the second component by one locking connection formed by the locking protrusions.

8. The current measuring device according to claim 7, wherein the first component is cuboid.

9. The current measuring device according to claim 6, wherein the first component and the second component are secured to each other by a hinge and by a closure, while the open receiving space at the two opposite sides is formed between the hinge and the closure and between the first component and the second component.

10. The current measuring device according to claim 9 wherein the hinge includes a film hinge and the closure includes a detent.

11. The current measuring device according to claim 6, wherein the at least one contact bar is formed as a metal band or a metal plate, and wherein the receiving space provided to receive the at least one contact bar is cuboidal, a height of the receiving space corresponding to a height of the at least one contact bar, while a width of the receiving space either corresponds to a width of the at least one contact bar or is greater than the width of the at least one contact bar.

12. The current measuring device according to claim 5, wherein the first component comprises a first housing and a measurement board situated therein with a measurement circuit designed to detect the measurement signal.

13. The current measuring device according to claim 12, wherein the second component comprises a second housing and a shielding component at least partly arranged therein and/or fastened thereon, by which a magnetic field generated by the electric current present in the at least one contact bar is focused and/or homogenized and/or external magnetic fields are shielded away.

14. The current measuring device according to claim 5, wherein the current measuring device for detecting the measurement signal further comprises a Hall sensor and/or a magnetoresistive component.

15. A pulse inverter, comprising:
a module with multiple electronic components,
at least one contact bar sticking out from a side of the module for electrical contacting of the pulse inverter with a contact external to the pulse inverter,
wherein a measurement signal regarding an electric current strength present in the at least one contact bar can be detected by the current measuring device of claim 5,
wherein the pulse inverter further comprises a control board arranged on a top or bottom of the module with a driver circuit for control of the electronic components in dependence on the measurement signal and the driver circuit makes electrical contact with the module across control contacting pins of the module and with the current measuring device across measurement contacting pins of the current measuring device.

16. The pulse inverter according to claim 15, wherein:
the control board is connected:
to the current measuring device by press fit connections formed by the measurement contacting pins received in measurement contact openings of the control board; and/or
to the module by press fit connections formed by the control contacting pins received in control contact openings of the control board; and/or
the current measuring device is fastened to the at least one contact bar and/or the control board by at least one screw and/or glue connection.

17. The pulse inverter according to claim 15, wherein the at least one contact bar is a metal band or a metal plate.

18. The pulse inverter according to claim 17, wherein a surface of the at least one contact bar and a plane of the control board run substantially parallel to each other and the control contacting pins and the measurement contacting pins run substantially perpendicular to the surface of the at least one contact bar and to the plane of the control board.

19. A motor vehicle comprising a pulse inverter according to claim 15.

* * * * *